United States Patent [19]

Stephanie et al.

[11] Patent Number: 5,891,257
[45] Date of Patent: Apr. 6, 1999

[54] TOOL FOR REMOVING PROTECTIVE ENCAPSULANTS

[75] Inventors: John Gregory Stephanie, Rochester; Miles Frank Swain, Hayfield, both of Minn.

[73] Assignee: International Business Machines Corporation, Armonk, N.Y.

[21] Appl. No.: 745,660

[22] Filed: Nov. 8, 1996

[51] Int. Cl.[6] .................................................. B08B 3/02
[52] U.S. Cl. .......................... 134/5; 134/198; 134/108; 134/902; 134/10; 134/34
[58] Field of Search .................................. 134/2, 43, 44, 134/93, 108, 137, 10, 902, 34, 5

[56] References Cited

U.S. PATENT DOCUMENTS

| | | | |
|---|---|---|---|
| 3,796,185 | 3/1974 | Boone | 118/325 |
| 3,969,813 | 7/1976 | Minetti et al. . | |
| 4,344,809 | 8/1982 | Wensink . | |
| 4,529,790 | 7/1985 | Kamio et al. | 528/107 |
| 4,822,441 | 4/1989 | Ohta et al. . | |
| 5,232,758 | 8/1993 | Juskey et al. . | |
| 5,252,179 | 10/1993 | Ellerson et al. . | |
| 5,255,553 | 10/1993 | Hale et al. | 73/19.1 |
| 5,274,913 | 1/1994 | Grebe et al. . | |
| 5,371,328 | 12/1994 | Gutierrez et al. . | |
| 5,381,304 | 1/1995 | Theroux et al. . | |
| 5,392,980 | 2/1995 | Swamy et al. . | |
| 5,512,613 | 4/1996 | Afzali-Ardakani et al. . | |

OTHER PUBLICATIONS

Lee, Henry et al., *Handbook of Epoxy Resins*, (1967), pp. 12-2-13-1.

*Primary Examiner*—Marian C. Knode
*Assistant Examiner*—Brenda G. Brumback
*Attorney, Agent, or Firm*—John J. Gresens; Matthew J. Bussan

[57] ABSTRACT

A system for removing protective coatings from a circuit board assembly. The system includes a tool for removing protective coatings from a circuit board assembly. The tool has a flow head, which includes a support, having an opening which is adapted to contact the circuit board assembly and flow solvent to the surface of the circuit board. The flow head may also include a solvent nozzle positioned within the support. The solvent nozzle has an opening adapted to apply solvent to the circuit board assembly. The flow head also includes a solvent recovery volume positioned beneath the support and adjacent to the nozzle. The system also includes a second solvent reservoir, a mechanism for applying heat to the reservoir, and a mechanism for circulating solvent from the reservoir to the flow head and back to the reservoir.

25 Claims, 5 Drawing Sheets

TOOL FOR REMOVING PROTECTIVE ENCAPSULANTS

FIELD OF THE INVENTION

The invention relates generally to the selective dissolution of thermosetting polymeric compositions. More specifically, the invention relates to tools and systems for the removal of protective encapsulants from integrated circuit assemblies.

BACKGROUND OF THE INVENTION

Epoxy compositions are widely used as coatings, adhesives, structural components and encapsulants in the manufacture of integrated circuit assemblies. As thermosetting compositions, the epoxy materials are difficult or impossible to remove after curing. If a wirebonded chip, encapsulated with epoxy, fails, there is currently no way to remove the encapsulant, remove the chip and replace it with a good chip. The board, therefore, usually has to be discarded.

Representative methods and apparatus for reworking packaging and adhesives include Gutierrez, U.S. Pat. No. 5,371,328 which teaches rework of circuit modules containing unusable electronic components which were previously coated. Gutierrez teaches use of a non-stick release layer applied between the chip and the substrate and inhibits the epoxy from adhering to the substrate. Grebe, U.S. Pat. No. 5,274,913 also teaches a method of fabricating a reworkable module using a release layer under the chip encapsulant, such as, flip chip or ball grid array.

Juskey, et al., U.S. Pat. No. 5,232,758 teaches non-hardening solvent removal hydrophobic conformal coatings using a wax. Generally the encapsulant comprises a metal alkyl benzyl sulfonate, which are dispensed by several common methods over electronic components, to impart a water resistant coating. The wax may be removed by dissolution in any number of non-polar low molecular weight hydrocarbons.

Ohta, et al., U.S. Pat. No. 4,822,441 discloses a plastic mold decapsuling apparatus taught to remove the plastic molding compound from molded components. The tool consists of two pumps, a plunger pump for moving nitric acid to a reservoir and a gear pump for moving it to the mold holder. High pressure solvent flow is used to remove plastic molding over circuit assemblies.

Minetti et al., U.S. Pat. No. 3,969,813 depicts a method and apparatus for removal of semiconductor chips from hybrid circuits. The Minetti tool consists of 4 or 5 jet streams directed at adjacent sides of the encapsulated element which has a top and bottom surface. High pressure jet streams in the range of 12,000 to 20,000 psi, are deflected off the substrate to the bottom surface of the element and tend to lift the element off the surface.

Wensink, U.S. Pat. No. 4,344,809, discloses a jet etch apparatus for decapsulation of molded devices. The Wensink tool is used to remove the epoxy molding compound from an encapsulated electronic component. Ellerson, et al., U.S. Pat. No. 5,252,179 discloses an apparatus and method for selectively etching plastic encapsulating material. Ellerson discloses a tool for removing encapsulant from underneath a chip or ball grid array package which relies upon positioning a shielding fixture over the top surface of the electronic device.

Some of these processes and assemblies use easily removable or dissolvable encapsulants. However, when a cured thermoset encapsulant is used, prior efforts have included assemblies which use high solvent pressure and flow rate. These devices may tend to have a deleterious effect on the circuit assembly and may not allow for secure encapsulation and nondestructive repair.

As a result, there is a need for methods and apparatus which will remove integrated circuit elements in a nondestructive manner allowing reuse of the otherwise operable assembly.

SUMMARY OF THE INVENTION

In accordance with a first aspect of the invention, a tool for removing protective coatings from a circuit board assembly is provided. The tool is a flow head which includes a support, having an opening which is adapted to contact the circuit board assembly and flow solvent to the surface of the circuit board. The flow head also includes a solvent nozzle positioned within the support. The solvent nozzle has an opening adapted to apply solvent to the circuit board assembly. The nozzle opening is positioned beneath the support opening to provide scrubbing action during the application of solvent to the circuit board assembly. The flow head may also have a solvent recovery volume positioned beneath the support. The recovery volume surrounds the nozzle and is configured to collect the solvent which has been applied to the circuit board assembly.

In accordance with a further aspect of the invention, a system for removing protective coatings from a circuit board assembly is provided. The system includes a tool for removing protective coatings from a circuit board assembly. The tool is a flow head having a support, solvent nozzle, and recovery volume. The system also includes a second system solvent reservoir, means for applying heat to the system solvent reservoir, and means for circulating solvent from the system solvent reservoir to the flow head and back to the system reservoir.

In accordance with an additional aspect of the claimed invention, a method of using the system disclosed herein for removing protective coating from a circuit board assembly is provided.

One aspect of the invention is a tool for removing encapsulant compositions. Circuit board assemblies such as single sided and double sided assemblies, integrated circuit boards, as well as other types of surface mount technology including chip carriers and multichip modules among other elements are often protected with coatings, encapsulants and sealants. Generally, thermosetting resins are used for these sealing and encapsulating utilities. As thermosetting compositions, these materials are difficult to remove after curing. However, we have discovered that under certain conditions, encapsulants may be dissolved. This allows the encapsulant to be removed for repair, replacement, recovery, or recycling of one or more elements of the circuit board assembly.

For example, in the case of wirebonded chips or the reinforcement of solder joints in microelectronic applications, removal of the encapsulant allows replacement of obsolete or defective devices, saving the cost of discarding valuable components in a microelectronic circuit assembly.

If an electronic assembly is populated with components having epoxy reinforced solder joints or encapsulated chips, and the printed circuit board becomes defective, the epoxy or encapsulant can be removed allowing recovery of valuable components which can be reclaimed and assembled on circuit boards.

Other problems may also be solved. For example, during the encapsulation of wirebonded chips, sometimes the wirebonds sweep together causing a short which is not detected until after the encapsulant is cured and the part electrically tested. Removal of the encapsulant would allow the wirebonds to be separated and the chip to once again be encapsulated, instead of throwing the entire part away.

Encapsulants and solvent systems for removing the encapsulants which are exemplary of those compositions which the invention can be used with are disclosed in U.S. patent application Ser. No. 08/574,806, filed Dec. 19, 1995 and U.S. Pat. No. 5,512,613 issued Apr. 30, 1996 both of which are incorporated herein by reference.

DETAILED DESCRIPTION OF THE PREFERRED EMBODIMENTS

Figure 1:
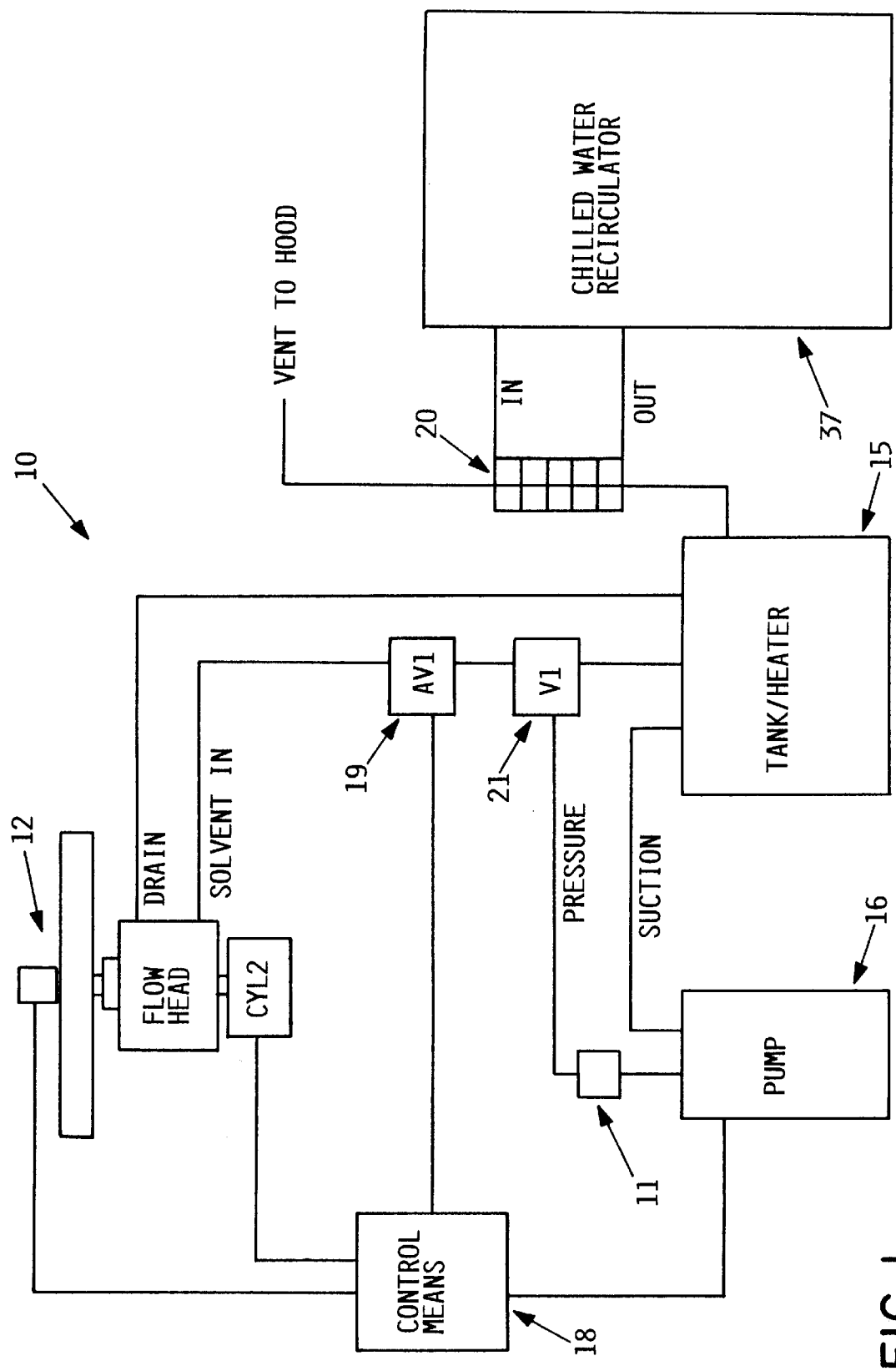
FIG. 1 is a schematic diagram of one embodiment of the system of the invention including the tool for removing reworkable encapsulants from specific areas on substrates.
Figure 2A:
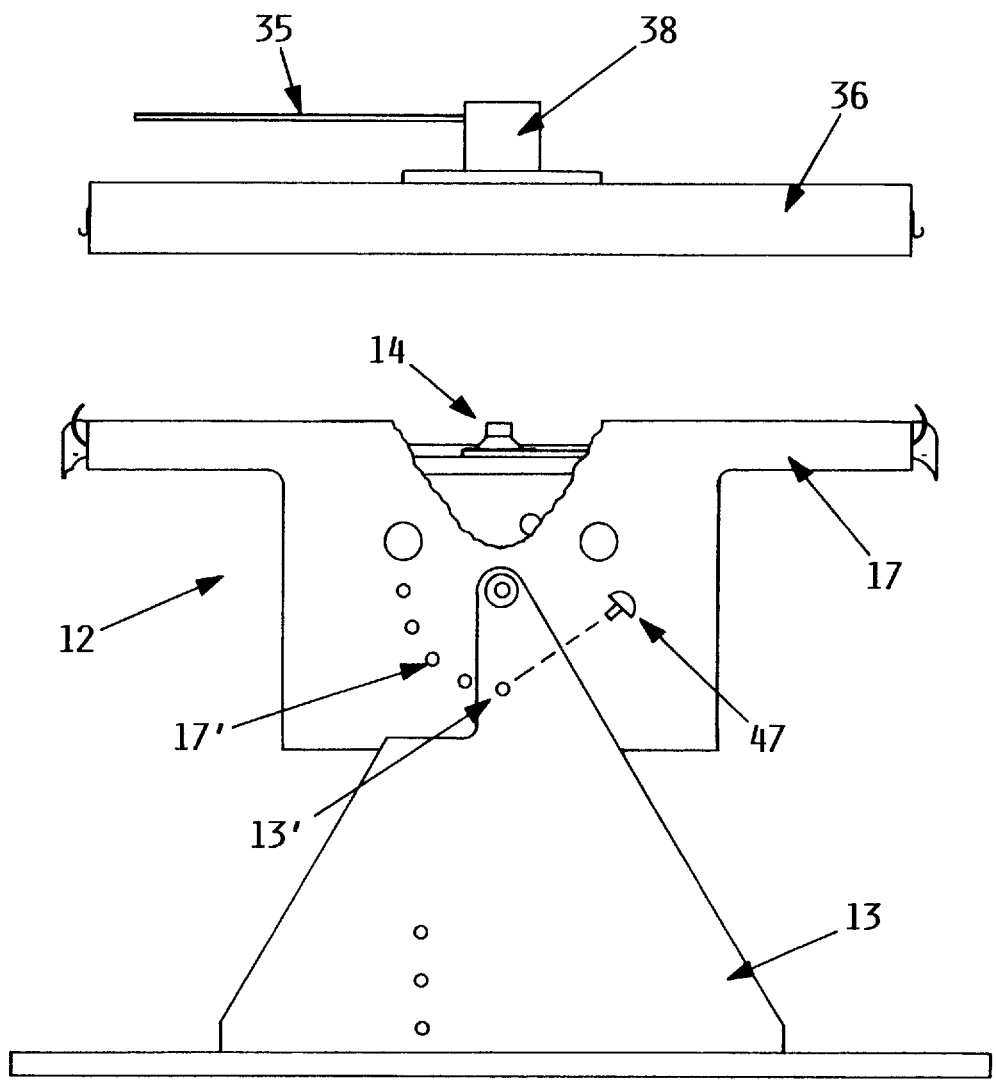
FIG. 2A is a side view of one embodiment of the tool of the invention partially cut away to show the platform.
Figure 2B:
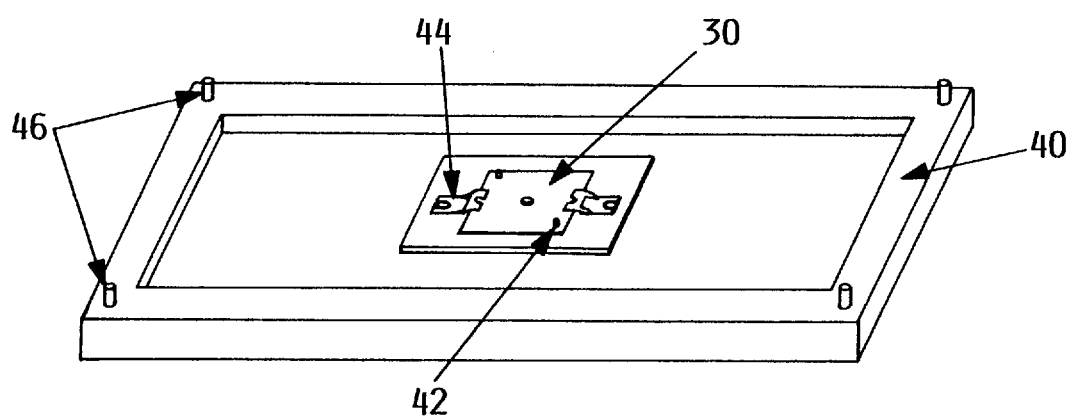
FIG. 2B is a perspective view of one embodiment of a fixture used with the tool in accordance with the invention.
Figure 2C:
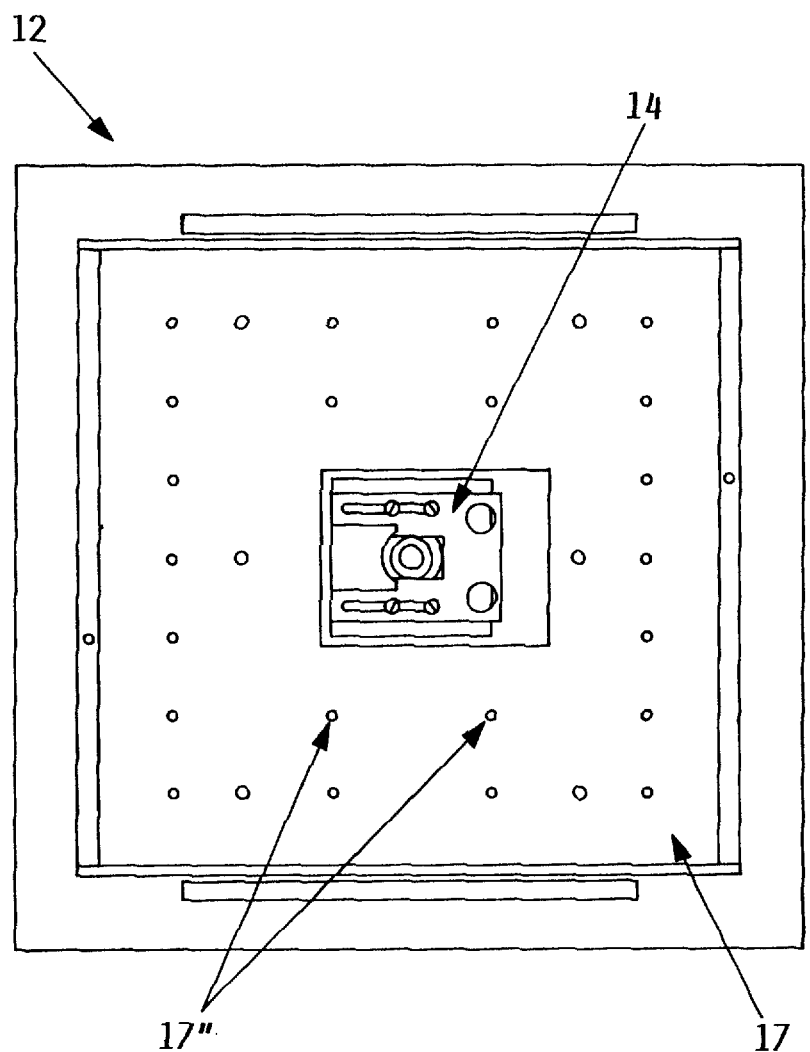
FIG. 2C is a top plan view of one embodiment of the tool of the invention.
Figure 3:
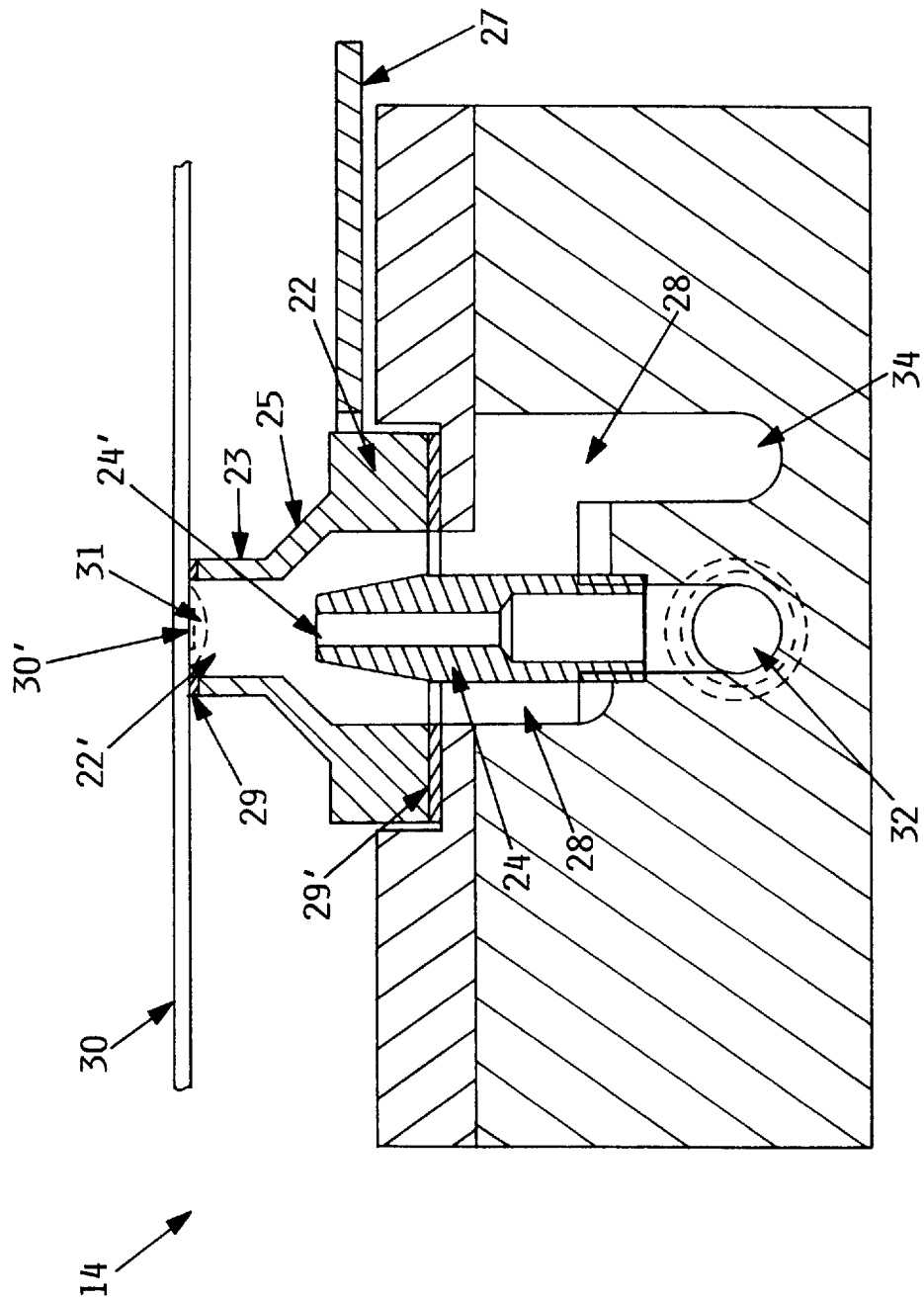
FIG. 3 is a cross-sectional view of a flow-head assembly in accordance with one embodiment of the invention.

Turning to the figures wherein like parts are designated with like numerals throughout a number of views, there is shown a system 10 for removing protective coatings from a circuit board assembly in FIGS. 1–3. The system includes a tool 12 for encapsulant removal, means for circulating solvent through the system such as tubing and pump 16, a heated solvent reservoir 15, an in-line filter 11, means 18 to control the flow of solvent as well as the other functions in the system, and means 37 to control vapors which may be emitted from the system, which may include a vapor condenser 20.

The tool 12 for removing encapsulants and protective coatings from a circuit board assembly comprises a flow head 14, a base 13 and platform 17, FIG. 2A. The flow head 14 has a support 22, having an opening 22' which is adapted to contact the circuit board assembly 30 and flow solvent to the surface of the circuit board, FIG. 3.

Tool 12 may additionally comprise a cover 36, FIG. 2A, with means 38 such as a plunger activated by pneumatic pressure through line 35 for securing the integrated circuit assembly 30 adjacent the support opening 22'. The flow head 14 also has a solvent nozzle 24 positioned within the support 22. The solvent nozzle 24 may be screwed into the flow head 14. The solvent nozzle 24 has an opening 24' adapted to apply solvent to the circuit board assembly.

The nozzle opening 24' is positioned beneath the support opening 22' to provide scrubbing action during the application of solvent to the circuit board assembly 30. The flow head 14 also contains a solvent recovery volume 28 positioned beneath support 22. The solvent recovery volume 28 is configured to collect the solvent which has been applied to the circuit board assembly. Additionally, the recovery volume 28 is preferably configured to surround and is positioned adjacent the flow head solvent nozzle 24. This allows the recovery volume to support and maintain the heat of the solvent passing through the nozzle 24 and contacting the circuit assembly 30, shown inverted on the support 22 in FIG. 3.

The flow head 14 also has a lock plate 27 for securing the position of support 22. Solvent enters the flow head 14 through inlet 32 and exits the flow head from the recovery volume 28 through outlet 34, FIG. 3.

THE SYSTEM AND THE TOOL

The system of the invention is useful for removing encapsulants and protective coatings from circuit assemblies. To this end, the system includes a tool 12 having a number of components. The predominant component of the tool is the flow head 14, FIG. 3. The flow head 14 comprises support 22 which functions to support the circuit assembly during cleaning. To this end, the support may comprise any number of different shapes, sizes, or materials.

As can be seen in FIG. 3, in one preferred mode, the support comprises two portions. The bottom portion 25 of the support is conical in shape and lies adjacent the locking plate 27. The upper portion 23 comprises a cylindrical shape. The cylindrical shape on the upper portion 23 of the support 22 functions to isolate the specific device on the circuit assembly which is to be contacted with solvent. Further, the narrow diameter of the upper portion 23 of the support also functions to focus solvent flow onto the specific intended device on the circuit assembly.

The lower portion 25 of the support is conical in nature and generally may have a broadening diameter which may be larger than the diameter of the solvent nozzle. This allows for solvent solution to move up contacting the circuit assembly 30 and then flow down along the side walls of the lower portion 25 of the support 22 into the recovery volume 28 of the flow head 14.

The support may take any number of shapes and sizes depending on the given application or circuit assembly to be serviced. For example, the opening 22' of the support which contacts the circuit assembly may be designed to support a circuit assembly 30 which has a uniform, planar geometry. Additionally, the opening 22' of the support may also be designed to support a circuit assembly 30 which has a non-uniform or irregular geometry across the surface of the circuit assembly 30.

The support may also be designed with multiple openings 22' to address or apply solvent to any number of given devices on a single or multiple circuit assemblies at the same time. One means of sealing the opening 22' of the support 22 against the circuit assembly 30, is to use a deformable gasket 29. In order to seal the support 22 within the flow head 14, the support 22 may also rest on a gasket 29' of the same material. The deformable gasket 29 and 29' may be made of any materials which are nonreactive with the solvents used in the system. Exemplary materials include perfluorinated polymers such as Teflon® and Goretex®, polyethylenes, polyurethanes, and polyimides among others.

The opening 22' of the support may also have any number of different geometries such as circular, square, irregular, oval, hexagonal, quadrangular, etc.

The flow head assembly also includes an inlet 32 which leads to nozzle 24. Generally, in operation, solvent flows in through inlet 32 and is applied to the circuit assembly 30 which is inverted on top of the support 22. Here again, the nozzle may take any number of sizes depending upon the intended application. Representative nozzle sizes include 0.3 cm, which is intended to deliver a solvent flow of 1.5 liters per minute (lpm), and 0.6 cm, which is intended to deliver a solvent flow of 9 lpm max. Generally, the flow rate of solvent should range from about 1 lpm to 2 lpm.

We have found that the distance between the top 24' of the solvent nozzle 24 and the support opening 22' of the support is important in providing the necessary flow of solvent to the circuit assembly as well as in providind a scrubbing action which is effective in removing the resin from the particular intended device.

The support 22 may be held in place through locking plate 27. Generally, the distance between the solvent nozzle top 24' and the support top 22' ranges from about 1.0 cm to 2.0 cm, preferably from about 1.2 cm to 1.8 cm, and most preferably from about 1.3 cm to 1.6 cm.

The upper portion of the flow head may generally drain or flow into a solvent recovery volume 28. This volume 28 rests beneath the support 22 and preferably around the mid-portion of the nozzle 24, FIG. 3. This allows the volume to adequately catch solvent which is now exhausted from use in contacting the circuit assembly. Further, the passage of the heated solvent around the mid-portion 24 of the nozzle reduces heat loss in the solvent and ensures a certain level of efficacy in contacting the circuit assembly 30 and removing the encapsulant resin 31 from the intended device 30'.

The tool 12 used in the system of the invention may also generally comprise a base 13 and platform 17, FIG. 2A. The base may comprise any number of configurations which will suitably support the flow head 12 and platform 17. In this instance, it can be seen that the base 13 has a triangular configuration which is affixed to the platform 17 at either end. The base 13, and platform 17 may be configured to provide for rotation of the platform 17. As can be seen in FIG. 2A, a semicircular pattern of holes 17' may be defined which fit into a base hole 13' to allow rotation of the tool through any number of axes. A pin 47 may be inserted through hole 13' and one of the holes 17' to secure the platform in place. This allows for the venting of air which if present in the solvent system may hamper removal of the encapsulant covering the circuit assembly.

Generally, the circuit assembly may be held on support 22 through any variety of means which allow for adequate sealing of the surface of the circuit assembly 30 against support opening 22'. One means of placing the circuit assembly 30 adjacent the support 22 is through the means of a fixture 40 such as that seen in FIG. 2B. In this instance, the circuit assembly 30 is placed into the fixture 40 and held secured by means such as clips 44. Diagonal pins 42 may be used for registration of the fixture and the platform. The fixture 40 may then be inverted and placed on top of support opening 22' so that the appropriate portion of the circuit assembly is positioned in preparation for contact with solvent.

Once the fixture 40 has been placed in the tool of the invention, a cover 36, FIG. 2A, may be positioned over the tool platform 17. While the cover may have any number of means for holding the fixture 40 in place. One means of holding the fixture in place is through the use of a pneumatic or air actuated plunger 38, FIG. 2A, which may be activated by the pneumatic control system of the invention. The plunger acts to hold the fixture in place against the flow of solvent through the flow head 14. The fixture may also be keyed with pins 46, FIG. 2B, to coordinate with complementary holes 17", FIG. 2A, in the platform providing an additional means for holding the fixture 40, and in turn, the circuit assembly 30 in place.

The system of the invention generally also comprises a system solvent reservoir and heater 15, FIG. 1. The reservoir allows for the recirculation of solvent so that the solvent is economically and efficiently used. In most instances, the solvent may be ethylene glycol, n-butyl alcohol, xylene and mixtures thereof. Trifluroethanol may also be used. Each solvent system may also comprise added 0.3 molar methane sulfonic acid. The solvent generally runs through the system at a temperature ranging from 95° C. to 110° C. and preferably 100° C. to 105° C. for mixtures of first three solvents. The system may be run at 65° C. to 70° C. for trifluoroethanol.

Accordingly, the solvent reservoir is used to heat solvent before use so that it is at the proper application temperature. The solvent may then be drawn from the reservoir and pumped to the flow head. Once contacting the circuit assembly and through the flow head, the solvent may be returned to the reservoir for reheating, filtering, and any other recovery operations which are deemed necessary.

Generally, in single device applications, we have found that a solvent reservoir volume ranging from about 2 liters (l) to 5 l and preferably about 3 l to 4 l is more than adequate to process the device in a time ranging from about 5 to 20 minutes at a flow rate ranging from about 1 lpm to 2 lpm. The reservoir volume may be increased to allow for the use of a larger number of encapsulant removing tools at any one time. The time for encapsulant removal may vary depending on the amount of encapsulant, the nature of the solvent mixture and solvent temperature.

In the instant operation we have used a solvent reservoir having a capacity ranging from about 3 l to 4 l which has been heated at a temperature ranging from about 100° C. to 105° C. and passed to the flow head at a temperature ranging from about 100° C. to 105° C.

The system of the invention may also include means for circulating solvent. The circulating means is used to provide adequate pressure to transmit the solvent from the reservoir to the flow head. Any given circulating means which provides the necessary pressure to provide a flow ranging from about 1 lpm to 2 lpm at a temperature of about 95° C. to 100° C. maximum may be used.

In the system shown in FIGS. 1–3 the circulating means comprises a pneumatic pump and tubing. Commercially available pumps include Magnum 600 manufactured by Trebor, Inc. of West Jordan, Utah. This pump may be controlled by any means known to those skilled in the art.

The circulating means of the invention may also comprise any variety of tubing which when integrated with a control means allows for the flow of solvent from the system reservoir to the flow head and then returned to the system reservoir. Flow of solvent through this tubing may be controlled by means such as a pneumatic control valve 19 which works together with pump 16 to maintain a constant flow of heated solvent. A filter 11, FIG. 1, may be used to recover larger debris, present in the solvent, which has been freed from the circuit assembly. Filter size depends on the application, and generally varies from 5 to 50 microns, with a useful size ranging from about 5 to 10 microns.

The system of the invention may also comprise means for recovering solvent vapors. A vapor condenser is used to keep the solvent mixture from escaping into the environment, and maintain the proper mixture. One condenser useful in the claimed invention is a standard reflux glass condenser.

THE METHOD OF USE

A. The Encapsulant

The system of the invention is useful in recovering any number of protective coating and encapsulant compositions. Generally, those encapsulants which are processable with the system of the invention include those which are reworkable with solvents. One example of processable encapsulants includes diepoxides such as acetal diepoxides of the formula acetaldehyde bis-(3,4-epoxycyclohexyl methyl) acetal.

These epoxy structures are generally those derived from olefinic alcohols. The alcohol functionality preferably is an aliphatic primary or secondary alcohol group, and the olefinic functionality must be suitable for reaction with an epoxidation reagent known in the art, such as peracetic acid, perbenzoic acid, meta-chloroperbenzoic acid, potassium peroxymonosulfate, and the like.

The cyclic anhydride can be any of the well known anhydride curing agents (see, for example, Lee and Neville, Handbook of Epoxy Resins, McGraw-Hill, 1967, Chapter 12), including hexahydrophthalic anhydride, methylhexahydrophthalic anhydride, nadic methyl anhydride, maleic anhydride, and the like. For microelectronic applications, the preferred compositions will have anhydride/epoxy equivalence ratios of 0.90 or less to minimize degradation by moisture.

The hydroxy functional initiator can be any high boiling alcohol or polyol, such as ethylene glycol, diethylene glycol or the like. Optionally the flexibilizer can serve as the hydroxy functional initiator, by using a polyether diol such as polyethylene glycol, polypropylene glycol, poly(caprolactone)diol or poly(oxybutylene)diol.

The amine promoter can be any of the tertiaryamines known in the art such as benzyldimethyl amine, triethyl amine, pyridine and the like. For microelectronic applications, the preferred amine promoters are those which will raise the Tg of the moisture-stable formulations, for example, 1,5-diazabicyclo[4.3.0]non-5-ene, 1,8-diazabicyclo[5.4.0]undec-7-ene, 1-methylimidazole, or propoxylated imidazole.

The optional inorganic filler can be any of the powdered solids known in the art, such as alumina, silica, zinc oxide, etc. For microelectronic applications, the preferred filler is silica. Encapsulants are commonly filled with an inorganic powder to reduce the coefficient of thermal expansion. Suitable filler materials include alumina, silica, and the like. The preferred filler is a highly purified form of silica with particle size of 25 microns or less. The amount of filler may vary but is preferred in the range of 40–70% on a weight basis.

The optional flexibilizer can be any of the well known materials used for this purpose such as the Union Carbide ERL-4350, LHT-240 or the B. F. Goodrich butadiene-acrylonitrile copolymers sold under the trade name HYCAR. In addition, any polyetherdiol or polyesterdiol can be used as a flexibilizer including polyethylene glycol, polypropylene glycol, poly(caprolactone)diol, or poly(oxybutylene)diol. A preferred flexibilizer is one which does not significantly depress the glass transition temperature of the formulation, such as the maleic anhydride adducts of polybutadiene resins sold by Ricon Resins as R-130.

Pursuant to the invention, the combination of the low viscosity of the epoxy precursor mixture and the high modulus and relatively low CTE of the cured matrix has been found to be advantageous for an important device protection application. A particularly useful embodiment is the protection of solder ball interconnections of chips to ceramic or other substrates. A low viscosity precursor mixture can efficiently and completely fill the spaces between chip and substrate and envelop all interconnections with epoxy.

Cured epoxy generally provides remarkable enhancement of the solder ball interconnections with respect to times to failure in thermal cycling. Because of the ability, in view of this reinforcement, to mount large chips that would otherwise show unacceptable failure rates, this application for epoxy materials generates substantial interest. Wide application of this reinforcement, however, would require that the epoxy be removable in order to allow rework of a single chip in a microelectronic assembly. As stated above, cured epoxy resins are known for the intractability. Use of the compositions based on the cleavable diepoxides provides equivalent performance with added benefit of removability.

The epoxy formulations are cured by heating at 90°–200° C. for about 1–6 hours to from a hard tack-free solid. The preferred curing schedule includes a gel cure for about one hour at 80°–100° C., followed by a post-cure of about 2 hours at 135°–165° C.

B. Reworking the Encapsulant

In operation, the solvent solution is heated in the reservoir 15 of the system. When the solution temperature reaches about one half of the operating temperature, an air actuated valve 19 is closed and the pump is turned on to circulate the solvent in the system reservoir 15.

When the solvent reaches operating temperature, a fixture 40, see FIG. 2B, is placed above the flow head 14 and clamped in place. This fixture is used to warm the solvent and the system to a temperature which facilitates encapsulant removal. The cover 36 is placed on the platform and a pneumatic valve closes the plunger 38 and raises the flow head 14 so that the support 22 contacts substrate assembly 30. Valve 19 is opened allowing the solvent to circulate through the entire system 10. This is done to bring the flow head 14 up to temperature, so there is no temperature drop at the beginning of the removal cycle. When the flow head 14 is at temperature, valve 19 is closed, and the warm-up fixture removed.

Using a similarly configured fixture 40, an encapsulated chip 30' is placed above the flow head and clamped in place. An air actuated plunger moves the flow head 14 up so that support 22 is tight against the substrate 30. Once valve 19 is opened, the solvent flows over the encapsulated chip 30' with a minimum of pressure. After a certain amount of time, valve 19 is closed and the flow head 14 is lowered.

The flow head shown in FIG. 3 may be used to remove encapsulation from an individual chip on a given part, without effecting surrounding components also on the assembly. This can also be expanded to multi-nozzle flow heads for removing more than one chip on the same part.

The encapsulant resin formulations may be dissolved by hydrolysis or trans-etherification of the epoxy using an alcohol and an acid, but in order to dissolve the matrix and organic solvent is also needed. Many mixtures of organic solvents, acid or acids, and water can be used.

For the purposes of this invention, suitable acids include organic acids such as acetic acid, propionic acid, chloroacetic acid, benzoic acid and the like; sulfonic acids such as benzenesulfonic acid, p-toluenesulfonic acid, methanesulfonic acid and the like; inorganic acids such as sulfuric acid, phosphoric acid, hydrochloric acid, and the like; and Lewis acids such as boron trifluoride etherate, aluminum chloride, stannic chloride and the like.

These structures are exemplary only and are disclosed to illustrate the type of solvents and acids to be used. The preferred acids are methanesulfonic acid and p-toluenesulfonic acid. The following mixtures are given only as examples.

The temperatures of the solvent mixture can be 25° C. or above, but for most rapid dissolution the solvents should be heated to boiling or near boiling. One useful mixture is that of ethanol, acetic acid, and water which is particularly effective in dissolving the cured formulations based on the diepoxide encapsulant resins. Other suitable solvent mixtures include a combination of gamma-butyrolactone, water, and phosphoric acid and a combination of butanol, acetic acid and water. Acetals and ketals are also susceptible to trans-etherification under acidic conditions.

Thus it becomes possible to use an alcohol as both the solvent and the reactant, removing the necessity of adding water to the system thereby reducing the likelihood of corrosion of metallic components of the device. For example, a mixture of ethanol and an organic acid such as benzenesulfonic acid, para-toluenesulfonic acid, or methanesulfonic acid can be used to dissolve the cured epoxy based on the acetal diepoxide. Transetherification using a primary alcohol such as ethanol and an organic acid such as methanesulfonic acid is faster than hydrolysis in aqueous acid. An even faster dissolution rate was obtained by the incorporation of a portion of a less polar organic solvent such as xylene or benzyl alcohol or by the use of trifluoroethanol instead of ethanol.

The solvent used in accordance with the present invention comprises 10–100 parts, preferably about 30 parts, of a primary alcohol as exemplified by ethanol, methanol, n-butanol, and n-propanol; 0–90 parts, preferably about 30 parts, of a less polar organic solvent as exemplified by benzyl alcohol, xylene, toluene; and one to ten parts, preferably about 3 parts of an organic acid as exemplified by methanesulfonic acid, p-toluenesulfonic acid and trifluoromethanesulfonic acid. Additionally, about 30 parts of ethylene glycol is used in the solvent. Optionally the solvent includes a surfactant and/or or a corrosion inhibitor.

Even at refluxing temperatures, the alcohols are also very benign with respect to attack of the dielectric matrix used in circuitry such as FR4 epoxy. For example, a mixture of ethanol and an organic acid such as benzenesulfonic acid, para-toluenesulfonic acid, or methanesulfonic acid can be used to dissolve the cured epoxy based on the acetal diepoxide.

The following table provides general guidelines for the method of the invention. These ranges are generally applicable to reworkable encapsulant compositions ranging in size from about 50 mg to 150 mg.

|  | Preferred | More Preferred |
| --- | --- | --- |
| Flow rate (lpm) | 1–2 lpm | 1 lpm |
| Pressure (psi) | <10 psi | <5 psi |
| Solvent (temperature) (°C.) | 95–105° C.[1] 65–73° C.[2] | 105° C.[1] 70° C.[2] |
| Removal time[3] | 5–15 min. | 5–10 min. |

[1]If mixture with ethylene glycol, n-butyl alcohol and methane sulfonic acid.
[2]If trifluoroethanol and methane sulfonic acid.
[3]Dependent on volume to be removed, this range is for about 0.05 to 0.15 grams of encapsulant.

WORKING EXAMPLE

The following working example is a nonlimiting illustration of the invention.

The work was undertaken in two steps, warming up the system, and then, encapsulant removal. The solvent was heated in the tank/heater 15 of the system, FIG. 1. This tank/heater was a 5-liter, 3-neck flask with a condenser in a Teflon® adapter in the center neck. A Teflon® suction tube from the flask (labeled suction, FIG. 1) was connected to a pneumatically operated dual diaphragm pump 16, which was a Magnum 600 pump from Trebor Inc. The Teflon® return tube to the 3-neck flask labeled pressure, FIG. 1, circulated the solution back to the flask after going through the pump and valve (V1) 21. The solution was heated by means of a heating mantle around the 3-neck flask and a variac. The air pressure to the pump was 15–20 psi.

After the solution started to heat, the control panel switch turned on the pump and with the manual ball valve, 21 (VI) open, the solvent circulated through the pump and back to the flask. When the solvent reached operating temperature (about 100° C.), a dummy part was placed in the warmed fixture 40 (FIG. 2B), placed above the flow head and clamped in place.

The fixture was a Teflon® block, which may vary in size to fit the part. A portion of the Teflon® was routed out forming a cavity in which the substrate or circuit board fits. Diagonal pins on the Teflon® fixture were used for registration to hold the part in alignment with support 22, FIG. 3. Small clamps 44 on either side of the fixture held it flat in the fixture.

A Goreply® seal 29 of expanded Teflon®, cut to fit the support opening 22', was used as a gasket between the support 22 and circuit board 30. Pins 46 (⅛") on the top of the Teflon® fixture 40 fit into holes 17" on the stainless steel platform 17, FIG. 2C, when the Teflon® fixture was flipped over so that the encapsulated chip 30' was facing down, FIG. 3.

Once the fixture was in place, the cover of the tool was clamped shut. A switch in the control box simultaneously operated an air actuated valve which pushed the plunger 38 on top of the Teflon® fixture holding it in place. The control box 18 also operated a second air actuated valve which moved the flow head 14 towards the circuit assembly 30, FIG. 3. Another switch on the control box opened pneumatic valve 19 (AV1), (FIG. 1) allowing the solution to flow through the solvent nozzle 24, FIG. 3. The solvent pressure was very low, less than 5 psi, and the flow rate varied between 1 and 2 liters per minute, preferably about 1.5 liters per minute. The solvent was circulated to warm up the tool to operating temperature of the solvent. Once up to temperature, valve 19 was closed, the two pneumatic valves holding the circuit assembly 30 firm and the support 22 against the board are turned off allowing the fixture 40 to be removed.

Encapsulant removal was then undertaken by placing a circuit assembly in a fixture and then placing the fixture in the system of the invention as was done during the warm up procedure. The encapsulant was based on an acetal-based epoxy, (acetaldehyde bis-(3,4-epoxy cyclohexyl methyl) acetal).

The nozzle 24, FIG. 3, was about ½ to ⅝ inch from the chip and the solvent flowed with a pulse action giving it some scrubbing action. The solvent flows by gravity down the sides of support 22, FIG. 3, to outlet 34, a Teflon® tube which carried solvent back to the 3-neck flask through an opening in the Teflon® adapter in which the reflux condenser was placed. After the encapsulant was removed from chip 30', the substrate assembly 30 was removed from the tool 12 in the same manner as described for the warm-up part.

A filter 11 was incorporated in the line after the solution exited the pump and prior to going to the removal tool 12. A 10 micron filter did not inhibit the flow of the solution.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A tool for removing protective coatings from a circuit board assembly, said tool comprising a flow head, said flow head comprising:
   (a) a support, having an opening which is adapted to contact the circuit board assembly and flow solvent to the surface of the assembly;
   (b) a solvent nozzle positioned within said support, said solvent nozzle having an opening adapted to apply solvent to the circuit board assembly, said nozzle opening positioned beneath said support opening to provide scrubbing action during the application of solvent to the circuit board assembly;
   (c) a locking plate, said locking plate configured to hold said support within said flow head; and
   (d) a solvent recovery volume positioned beneath said support and adjacent said solvent nozzle, said recovery volume configured to collect the solvent which has been applied to the circuit board assembly.

2. The tool of claim 1, wherein said solvent recovery volume has a solvent outlet.

3. The tool of claim 1, additionally comprising a platform, and a fixture for holding a circuit assembly, wherein said platform and said fixture have complementary keying, enabling said fixture to be held in place on said platform.

4. The tool of claim 1, additionally comprising a base affixed to said platform, wherein said base and said platform have complementary keying allowing for the angled positioning of said platform.

5. The tool of claim 1, wherein said solvent nozzle comprises a first end and a second end, said solvent nozzle first end having an opening to apply solvent to the circuit board assembly, said nozzle second end having a solvent inlet opening wherein said reservoir is positioned adjacent said solvent nozzle.

6. The tool of claim 1, wherein said support rises above said locking plate, said support comprising two portions, said first support portion comprises a conical shape and is positioned adjacent said locking plate, said second support portion comprises a cylindrical shape and has said support opening wherein said support second portion comprises a polymer of monomers selected from the group consisting of a polymer of ethylene, propylene, fluorinated ethylene, and mixtures thereof.

7. The tool of claim 1, wherein said support opening has a diameter ranging from about 0.5 cm to 2 cm.

8. The tool of claim 1, wherein said support opening has a square shape.

9. The tool of claim 1, wherein said support opening is adapted to contact a planar circuit board assembly.

10. The tool of claim 1, wherein said support opening is adapted to contact a nonplanar circuit board assembly.

11. A system for removing protective coatings from a circuit board assembly, said system comprising:
   (a) a flow head, said flow head comprising:
      (i) a support, having an opening which is adapted to contact the circuit board assembly and flow solvent to the surface of the circuit board;
      (ii) a solvent nozzle positioned within said support, said solvent nozzle having an opening adapted to apply solvent to the circuit board assembly, said nozzle opening positioned beneath said support opening to provide scrubbing action during the application of solvent to the circuit board assembly;
      (ii) a solvent recovery volume positioned beneath said support and adjacent said inlet, said reservoir configured to collect the solvent which has been applied to the circuit board assembly;
      (iv) a locking plate, said locking plate configured to hold said support within said flow head, said solvent nozzle comprises a first end and a second end, said solvent nozzle first end having an opening to apply solvent to the circuit board assembly;
   (b) a solvent reservoir;
   (c) means for applying heat to said reservoir; and
   (d) means for circulating solvent from said second reservoir to said flow head and back to said second reservoir.

12. The system of claim 11, wherein said flow head additionally comprises a locking plate, said locking plate configured to hold said support within said flow head, said solvent nozzle comprises a first end and a second end, said solvent nozzle first end having an opening to apply solvent to the circuit board assembly, said nozzle second end having a solvent inlet opening, and said solvent recovery volume is positioned adjacent said solvent nozzle.

13. The system of claim 12, wherein said support rises above said locking plate, said support comprising two portions, said support first portion comprises a conical shape, said first portion is positioned adjacent said locking plate, said support second portion comprises a cylindrical shape, wherein said support second portion comprises a polymeric material resulting from monomers selected from the group consisting of a polymer of monomers, ethylene, propylene, fluorinated ethylene, and mixtures thereof.

14. The system of claim 11, wherein said support opening has a diameter ranging from about 0.5 cm to 2 cm.

15. The system of claim 11, wherein said support opening is adapted to contact a planar circuit board assembly.

16. The system of claim 11, wherein said support opening is adapted to contact a nonplanar circuit board assembly.

17. The system of claim 11, wherein said system additionally comprises a cover, said cover comprising means for securing said integrated circuit assembly adjacent said support.

18. The system of claim 17, wherein said securing means comprises a pneumatically activated plunger.

19. A method of using a system for removing protective coating from a circuit board assembly, said system comprising a flow head, said flow head comprising a support, having an opening which is adapted to contact the circuit board assembly and flow solvent to the surface of the circuit board, a solvent nozzle positioned within said support, said solvent nozzle having an opening adapted to apply solvent to the circuit board assembly, said nozzle opening positioned beneath said support opening to provide a pulsing scrubbing action during the application of solvent to the circuit board assembly, said flow head further comprising a locking plate, said locking plate configured to hold said support within said flow head, said solvent nozzle comprises a first end and a second end, said solvent nozzle first end having an opening to apply solvent to the circuit board assembly;
   a solvent reservoir, means for applying heat to said reservoir, and means for circulating solvent from said reservoir to said flow head and back to said reservoir, said method comprising the steps of:
   (a) applying a heated solvent system from said solvent nozzle to the surface of an integrated circuit assembly; and
   (b) flushing the protective coating from the circuit board assembly into the flow head.

20. The method of claim 19, wherein said solvent has a temperature ranging from about 95° C. to 110° C.

21. The method of claim 19, wherein said circuit board assembly is inverted during processing.

22. The method of claim 19, wherein said protective coating comprises an epoxy-based adhesive.

23. The method of claim 19, wherein said solvent is selected from the group consisting of ethylene glycol, n-butyl alcohol, xylene, trifluoro-ethanol, and mixtures thereof.

24. The method of claim 19, wherein said solvent has a flow rate ranging from about 1 to 2 lpm.

25. The method of claim 19, wherein said solvent has a pressure ranging from about 1 to 5 psi.

* * * * *